(12) United States Patent
Kim et al.

(10) Patent No.: US 11,374,183 B2
(45) Date of Patent: Jun. 28, 2022

(54) METHOD OF MANUFACTURING DISPLAY DEVICE

(71) Applicant: SAMSUNG DISPLAY CO., LTD., Yongin-si (KR)

(72) Inventors: Jaesik Kim, Hwaseong-si (KR); Jaeik Kim, Seoul (KR); Yoenhwa Lee, Hwaseong-si (KR); Joongu Lee, Seoul (KR); Sehoon Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 139 days.

(21) Appl. No.: 16/815,662

(22) Filed: Mar. 11, 2020

(65) Prior Publication Data

US 2020/0313100 A1 Oct. 1, 2020

(30) Foreign Application Priority Data

Apr. 1, 2019 (KR) .......................... 10-2019-0037754
Sep. 9, 2019 (KR) .......................... 10-2019-0111583

(51) Int. Cl.
*H01L 51/00* (2006.01)
*H01L 51/56* (2006.01)
*H01L 27/32* (2006.01)
*H01L 51/50* (2006.01)

(52) U.S. Cl.
CPC ...... *H01L 51/0094* (2013.01); *H01L 27/3211* (2013.01); *H01L 51/0005* (2013.01); *H01L 51/502* (2013.01); *H01L 51/56* (2013.01)

(58) Field of Classification Search
None
See application file for complete search history.

(56) References Cited

U.S. PATENT DOCUMENTS

| | | |
|---|---|---|
| 9,153,797 B2 | 10/2015 | Kim et al. |
| 10,236,328 B2 | 3/2019 | Kim et al. |
| 2016/0268355 A1* | 9/2016 | Shi ....................... H01L 27/3246 |
| 2018/0261656 A1 | 9/2018 | Kim et al. |
| 2018/0277612 A1* | 9/2018 | Kim ....................... H01L 51/56 |
| 2020/0292942 A1* | 9/2020 | Guo ....................... G03F 7/165 |

FOREIGN PATENT DOCUMENTS

| | | |
|---|---|---|
| JP | 2012-136990 A | 7/2012 |
| KR | 10-0945729 B1 | 3/2010 |
| KR | 10-1242031 B1 | 3/2013 |
| KR | 10-2014-0082089 A | 7/2014 |
| KR | 10-2018-0104784 A | 9/2018 |
| KR | 10-2018-0108948 A | 10/2018 |

* cited by examiner

*Primary Examiner* — Michelle Mandala
(74) *Attorney, Agent, or Firm* — Lewis Roca Rothgerber Christie LLP

(57) ABSTRACT

A manufacturing method of a display device includes: forming a first electrode on a base substrate; forming a pixel definition layer through which an opening is defined to expose an upper surface of the first electrode; providing an organic molecular thin film including a self-assembled monolayer on the first electrode and the pixel definition layer; desorbing a portion of the organic molecular thin film which corresponds to the first electrode; and providing at least one organic layer on the first electrode.

20 Claims, 20 Drawing Sheets

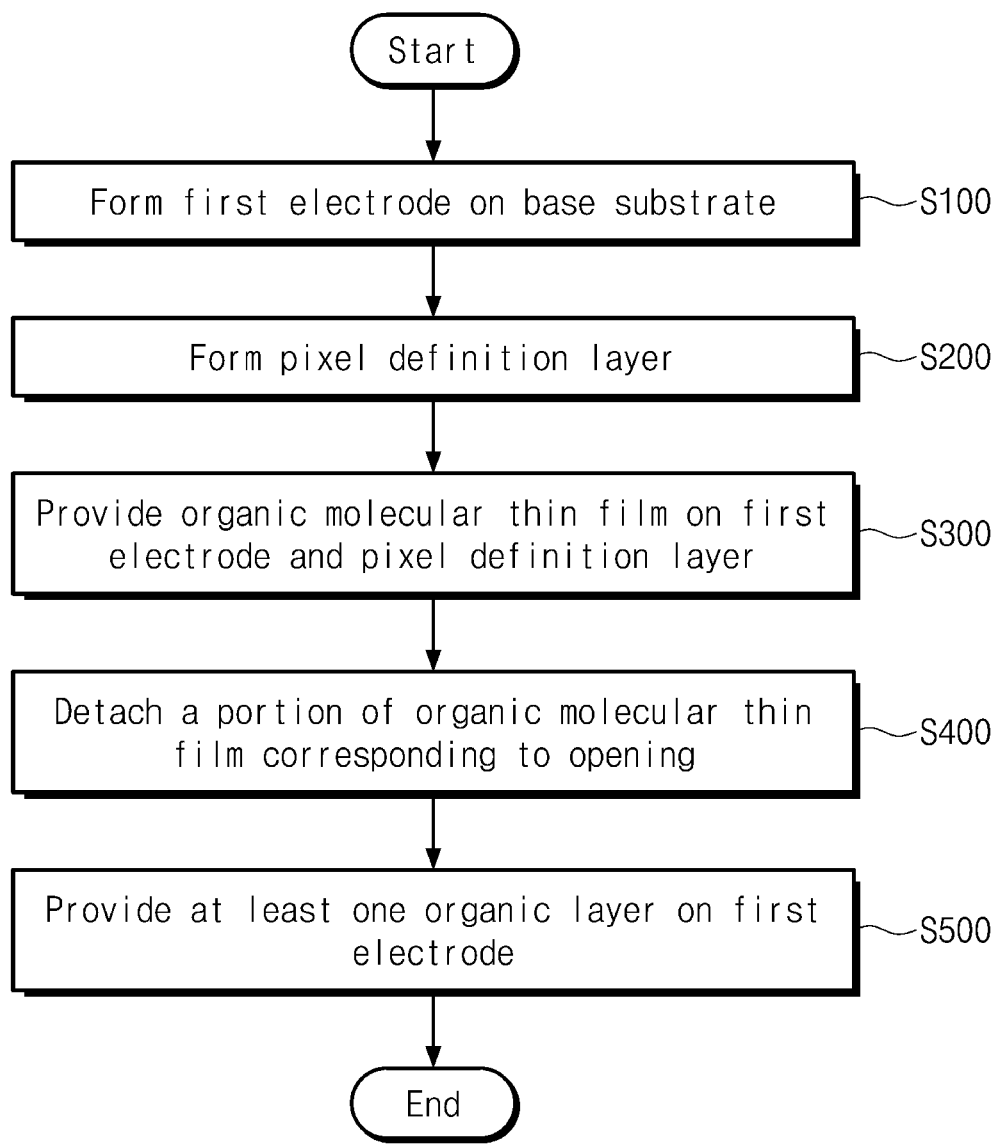

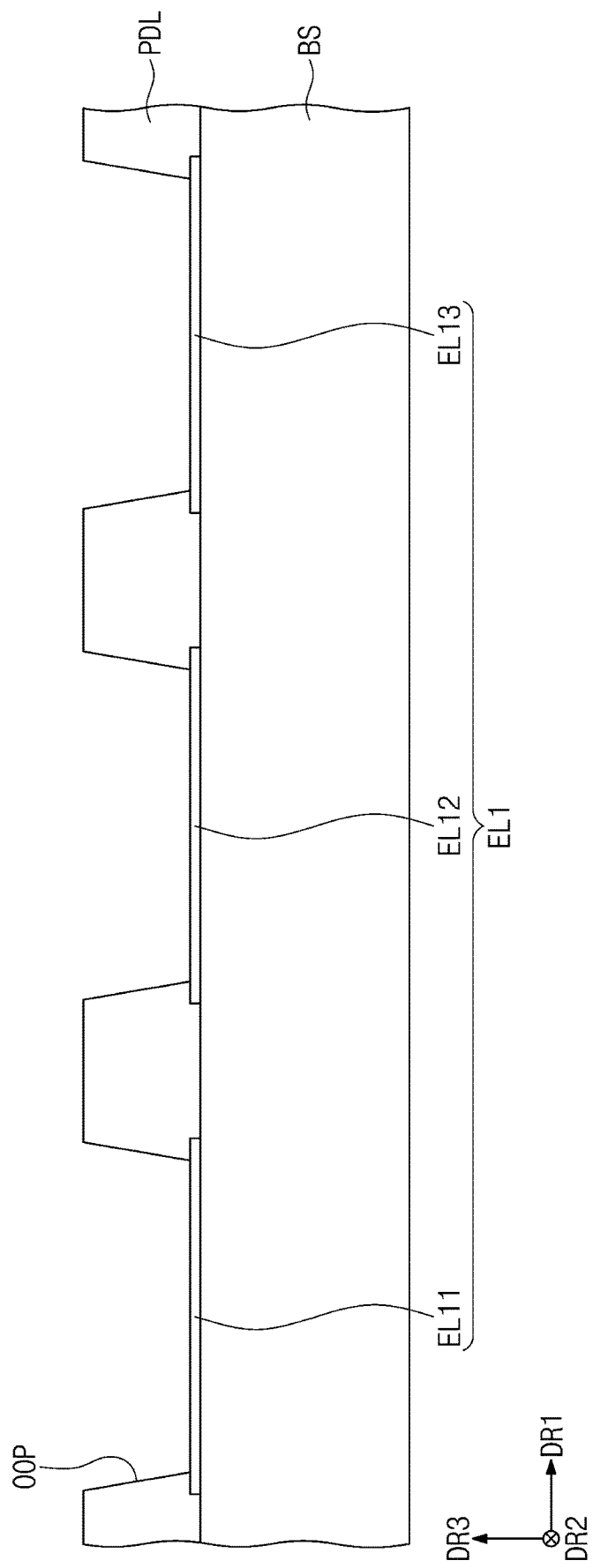

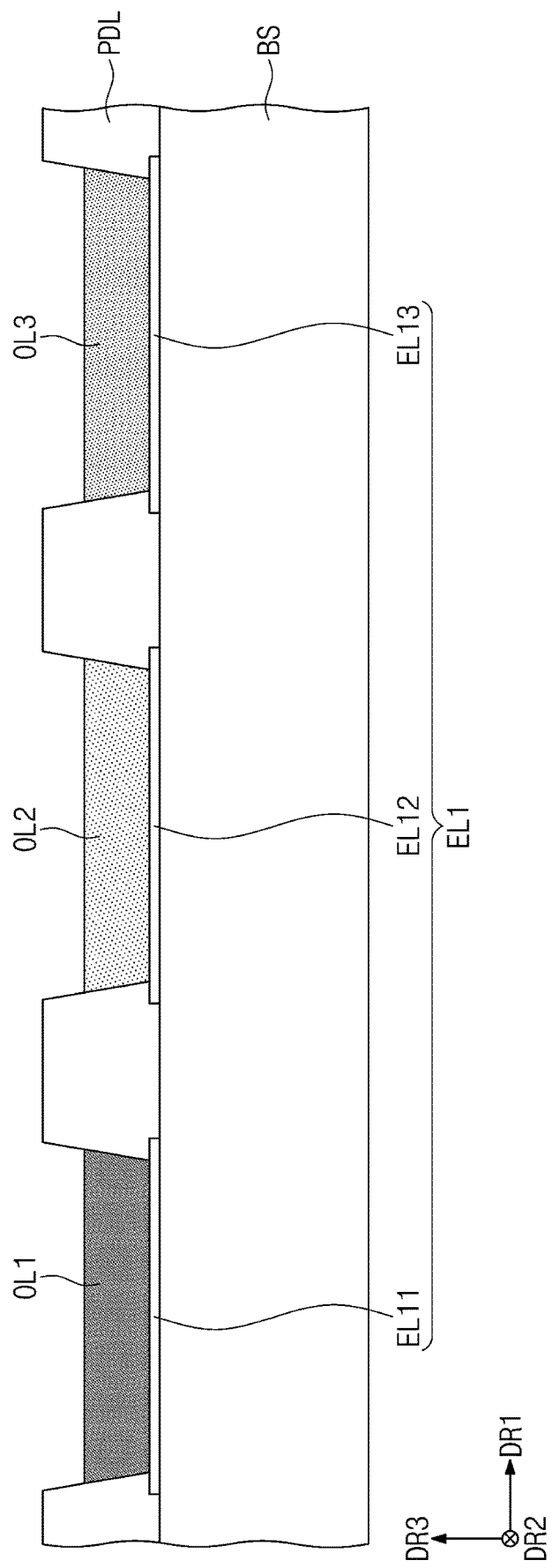

METHOD OF MANUFACTURING DISPLAY DEVICE

CROSS-REFERENCE TO RELATED APPLICATIONS

This application claims priority to and the benefit of Korean Patent Application Nos. 10-2019-0037754, filed on Apr. 1, 2019, and 10-2019-0111583, filed on Sep. 9, 2019, the entire content of each of which is hereby incorporated by reference.

BACKGROUND

1. Field

Aspects of embodiments of the present disclosure relate to a method of manufacturing a display device.

2. Description of the Related Art

In recent years, self-emissive display devices, such as an organic electroluminescent display device or a quantum dot light emitting display device, are actively being developed.

When a light emitting element is applied to a display device, a process of patterning an organic layer including a light emitting layer on an electrode at a high resolution is required. In particular, a patterning method that uses a fine metal mask (FMM) to pattern the organic layer is being suggested; however, the patterning method of the organic layer requires a plurality of processes, and, considering a process margin of the processes, there is a limitation in implementing an ultra-high resolution display device using the patterning method.

SUMMARY

According to an aspect of embodiments of the present disclosure, a method of manufacturing a display device, which includes patterning an organic layer using a self-assembled monolayer, is provided. According to another aspect of embodiments of the present disclosure, a method of manufacturing a display device, which is capable of patterning an organic layer with an ultra-high resolution, is provided.

According to an aspect of embodiments of the present disclosure, a method of manufacturing a light emitting type display device, which is capable of patterning an organic layer with an ultra-high resolution, is provided.

According to one or more embodiments of the inventive concept, a method of manufacturing a display device includes: forming a first electrode on a base substrate; forming a pixel definition layer through which an opening is defined to expose an upper surface of the first electrode on the base substrate; providing an organic molecular thin film including a self-assembled monolayer on the first electrode and the pixel definition layer; desorbing a portion of the organic molecular thin film which corresponds to the opening; and providing at least one organic layer on the first electrode.

In an embodiment, the self-assembled monolayer includes: a head group adsorbed to the first electrode and the pixel definition layer; a terminal group including a $CF_3$ group; and a spacer group between the head group and the terminal group and including four or more and twenty-five or less $CF_2$ groups.

In an embodiment, the head group includes a substituted or unsubstituted siloxane group or a substituted or unsubstituted acrylate group.

In an embodiment, the providing of the organic molecular thin film includes providing the self-assembled monolayer by thermal evaporation, chemical vapor deposition, or electron beam evaporation.

In an embodiment, the desorbing of the portion of the organic molecular thin film includes UV or plasma treating the organic molecular thin film.

In an embodiment, the desorbing of the portion of the organic molecular thin film includes providing a UV light above a mask including an opening area corresponding to the opening.

In an embodiment, the method further includes removing a remaining portion of the organic molecular thin film after the providing of the at least one organic layer on the first electrode.

In an embodiment, the removing of the remaining portion of the organic molecular thin film includes UV or plasma treating the remaining portion of the organic molecular thin film.

In an embodiment, the at least one organic layer includes a hole transport region, a light emitting layer, and an electron transport region, which are sequentially stacked on the first electrode.

In an embodiment, the providing of the at least one organic layer includes providing the at least one organic layer by an inkjet printing method.

According to one or more embodiments of the inventive concept, a method of manufacturing a display device includes: forming a first sub-electrode, a second sub-electrode, and a third sub-electrode, which are spaced apart from each other, on a base substrate; forming a pixel definition layer through which a plurality of openings is defined to expose upper surfaces of the first, second, and third sub-electrodes on the base substrate; providing a first organic molecular thin film including a self-assembled monolayer on the first, second, and third sub-electrodes and the pixel definition layer; desorbing a portion of the first organic molecular thin film which corresponds to an opening of the plurality of openings through which the upper surface of the first sub-electrode is exposed; providing a first organic layer on the first sub-electrode; desorbing a remaining portion of the first organic molecular thin film from the second sub-electrode, the third sub-electrode, and the pixel definition layer; providing a second organic molecular thin film including a self-assembled monolayer on the second and third sub-electrodes, the pixel definition layer, and the first organic layer; desorbing a portion of the second organic molecular thin film which corresponds to an opening of the plurality of openings through which the upper surface of the second sub-electrode is exposed; providing a second organic layer on the second sub-electrode; desorbing a remaining portion of the second organic molecular thin film from the first organic layer, the third sub-electrode, and the pixel definition layer; providing a third organic molecular thin film including a self-assembled monolayer on the third sub-electrode, the pixel definition layer, the first organic layer, and the second organic layer; desorbing a portion of the third organic molecular thin film which corresponds to an opening of the plurality of openings through which the upper surface of the third sub-electrode is exposed; providing a third organic layer on the third sub-electrode; desorbing a remaining portion of the third organic molecular thin film from the first organic layer, the second organic layer, and the pixel definition layer; and forming a second electrode on the first organic layer, the second organic layer, the third organic layer, and the pixel definition layer.

In an embodiment, the self-assembled monolayer includes a head group adsorbed to the first, second, and third sub-electrodes and the pixel definition layer, a terminal group including a CF$_3$ group, and a spacer group between the head group and the terminal group and including four or more and twenty-five or less CF$_2$ groups.

In an embodiment, the head group includes a substituted or unsubstituted siloxane group or a substituted or unsubstituted acrylate group.

In an embodiment, each of the first, second, and third organic layers includes a light emitting layer, and the light emitting layer includes an organic electroluminescent light emitting material or a quantum dot.

In an embodiment, the first organic layer, the second organic layer, and the third organic layer include a red light emitting layer, a blue light emitting layer, and a green light emitting layer, respectively.

In an embodiment, the providing of the first, second, and third organic molecular thin films includes providing the self-assembled monolayer by thermal evaporation, chemical vapor deposition, or electron beam evaporation.

In an embodiment, the desorbing of the first, second, and third organic molecular thin films includes UV or plasma treating the first, second, and third organic molecular thin films.

In an embodiment, at least one organic layer among the first, second, and third organic layers includes a hole transport region, a light emitting layer, and an electron transport region, which are sequentially stacked on at least one sub-electrode among the first, second, and third sub-electrodes.

In an embodiment, the providing of the first, second, and third organic layers includes providing at least one organic layer among the first, second, and third organic layers by inkjet printing.

In an embodiment, the self-assembled monolayer is a derivative corresponding to one of the following S1 to S6:

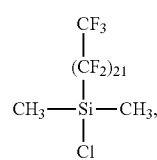
[S1]

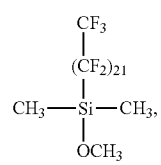
[S2]

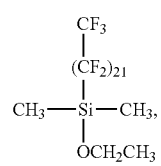
[S3]

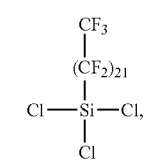
[S4]

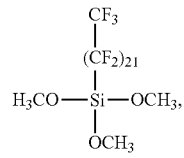
[S5]

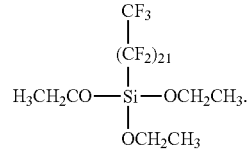
[S6]

According to the above, an organic layer may be patterned with ultra-high resolution by a manufacturing method of the display device.

A display device manufactured by the method according to the present disclosure may include the organic layer patterned with the ultra-high resolution.

BRIEF DESCRIPTION OF THE DRAWINGS

The above and other aspects of the present disclosure will become readily apparent by reference to the following detailed description when considered in conjunction with the accompanying drawings wherein:

FIG. 4 is a flowchart showing a method of manufacturing a display device according to an example embodiment of the present disclosure.

DETAILED DESCRIPTION

Figure 1:
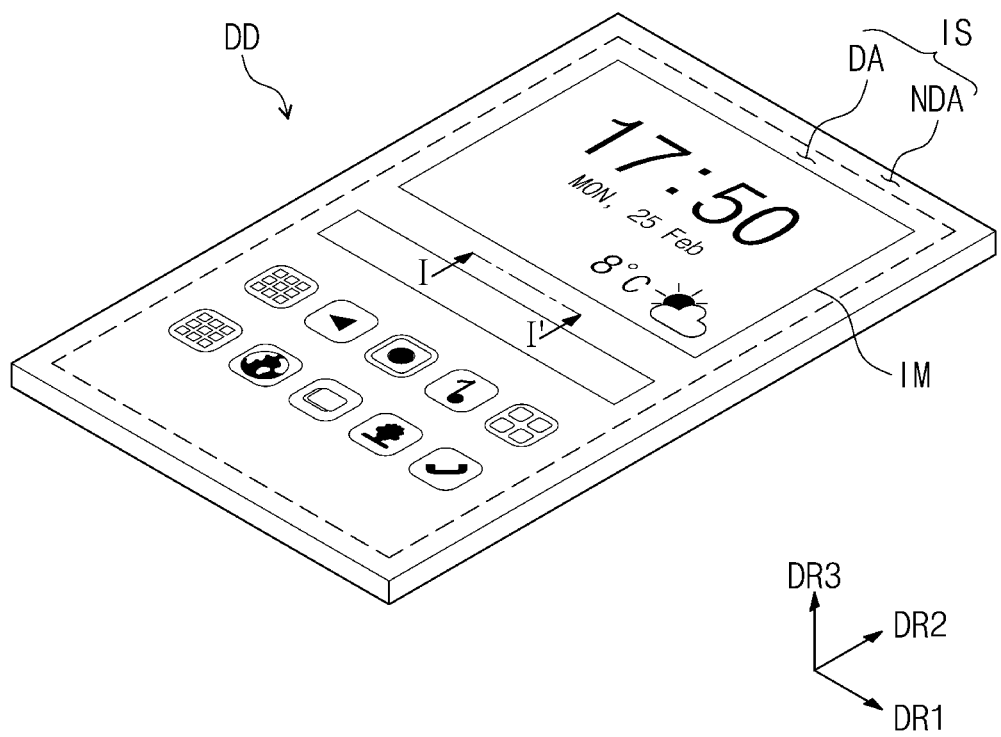
FIG. 1 is a perspective view showing a display device according to an example embodiment of the present disclosure.

The present disclosure may be variously modified and realized in many different forms, and, thus, specific embodiments will be illustrated in the drawings and described in further detail herein. However, the present disclosure should not be limited to the specific disclosed forms, and should be construed to include all modifications, equivalents, or replacements included in the spirit and scope of the present invention.

In the following descriptions, it is to be understood that when an element or layer is referred to as being "on," "connected to," or "coupled to" another element or layer, it may be directly on, connected, or coupled to the other element or layer or one or more intervening elements or layers may be present.

Like numerals refer to like elements throughout. In the drawings, the thickness, ratio, and dimension of components may be exaggerated for purposes of description of the technical content.

As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "on" or "above" the other elements or features. Thus, the example term "below" can encompass both an orientation of above and below.

Unless otherwise defined, all terms (including technical and scientific terms) used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

It is to be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Herein, the present disclosure will be explained in further detail with reference to the accompanying drawings.

Figure 2A:
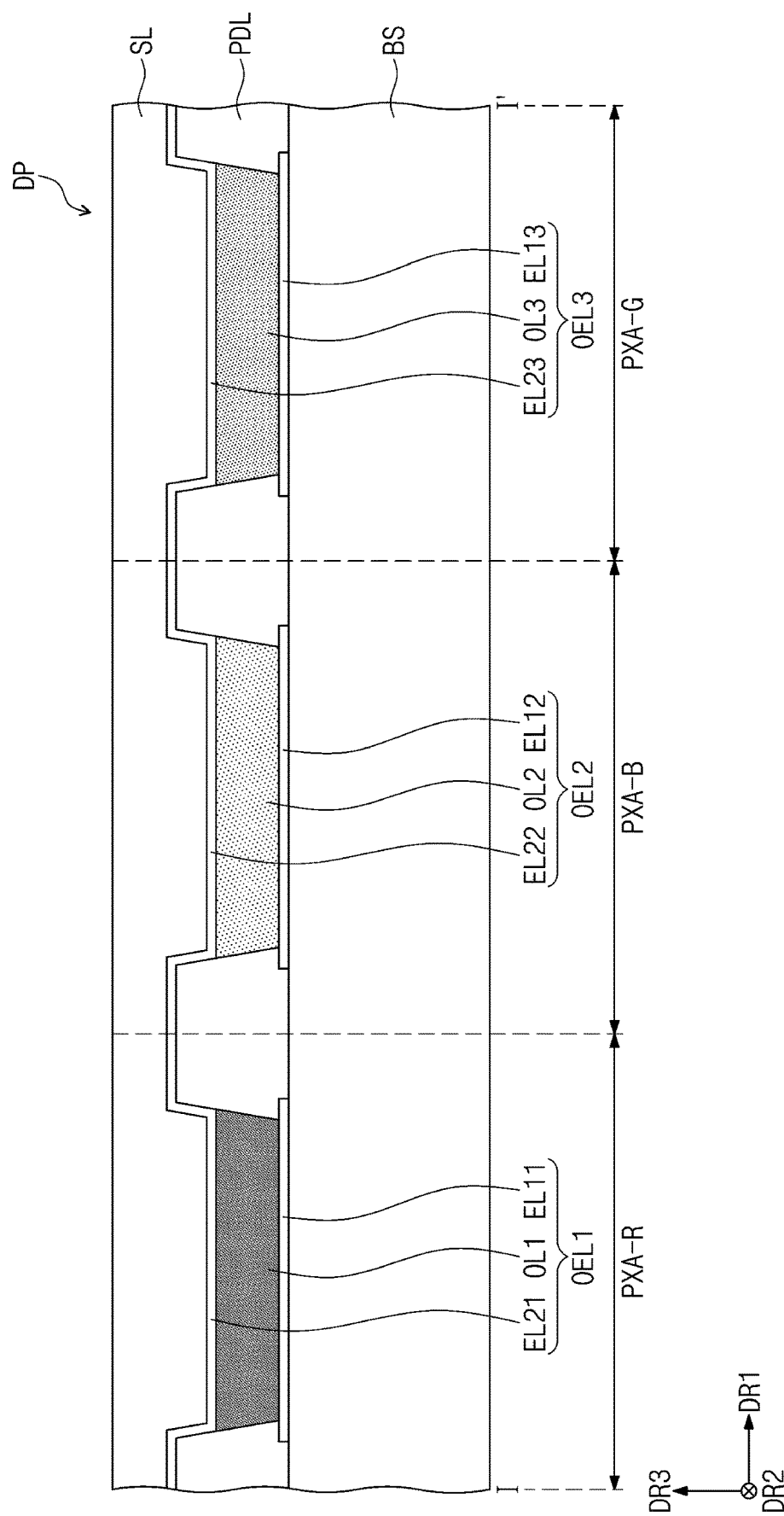
FIG. 2A is a cross-sectional view taken along the line I-I' shown in FIG. 1.
Figure 2B:
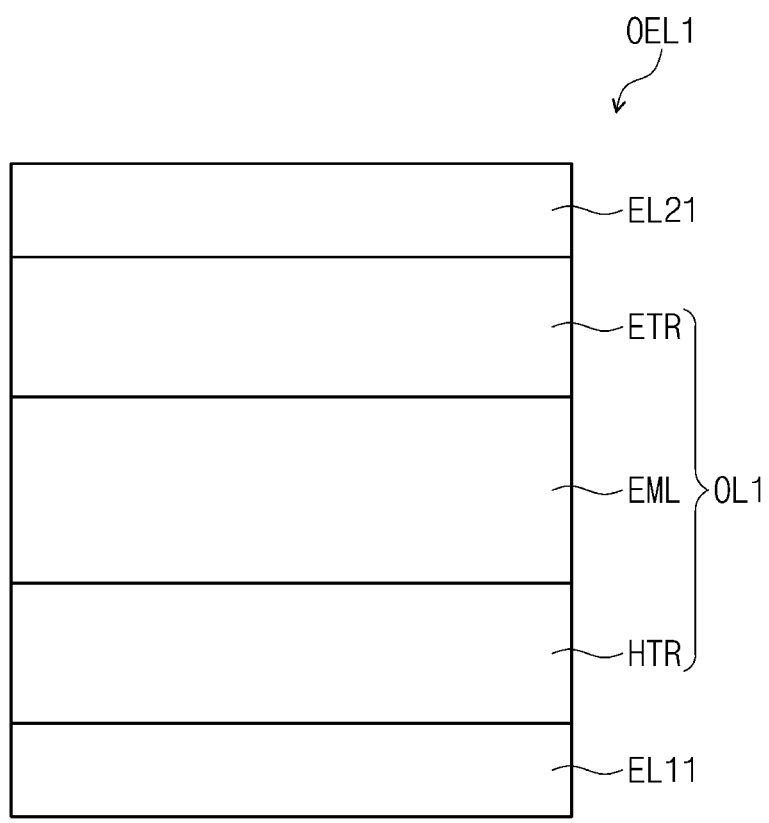
FIG. 2B is a cross-sectional view showing a first light emitting element of FIG. 2A.
Figure 3:
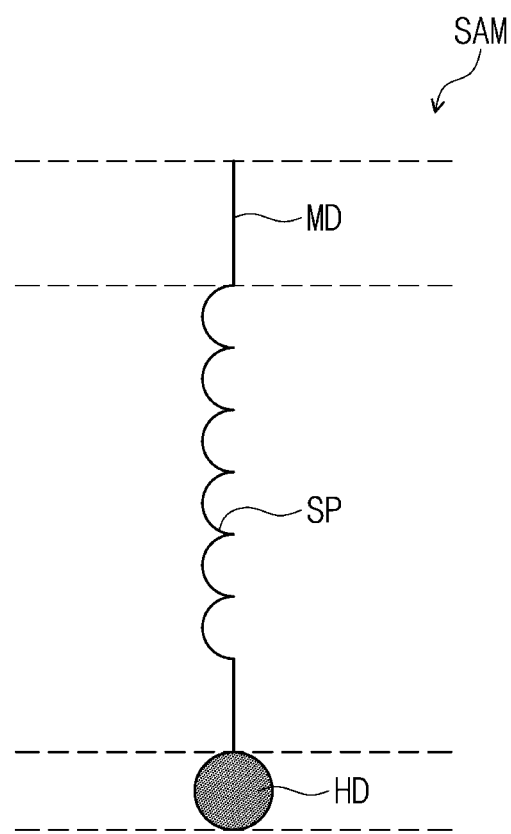
FIG. 3 is a view showing a self-assembled monolayer.

FIG. 1 is a perspective view showing a display device DD according to an example embodiment of the present disclosure; FIG. 2A is a cross-sectional view taken along the line I-I' shown in FIG. 1; FIG. 2B is a cross-sectional view showing a first light emitting element OEL1 of FIG. 2A; and FIG. 3 is a view showing a self-assembled monolayer SAM.

Referring to FIG. 1, a display surface IS of the display device DD, which provides an image IM to a user, is substantially parallel to a surface defined by a first directional axis DR1 and a second directional axis DR2. A third directional axis DR3 indicates a normal line direction of the display surface IS, i.e., a thickness direction of the display device DD. Front (or upper) and rear (or lower) surfaces of each member are distinguished from each other by the third directional axis DR3. However, directions indicated by the first, second, and third directional axes DR1, DR2, and DR3 are relative to each other and may be changed to other directions.

As shown in FIG. 1, the display surface IS of the display device DD may include a plurality of areas. The display device DD may include a display area DA through which the image IM is displayed, and a non-display area NDA defined adjacent to the display area DA. The image IM is not displayed through the non-display area NDA. FIG. 1 shows application icons and a clock application as a representative example of the image IM. In an embodiment, the display area DA may have a quadrangular shape. In an embodiment, the non-display area NDA may be disposed to surround the display area DA; however, example embodiments are not limited thereto or thereby. A shape of the display area DA and a shape of the non-display area NDA may be designed relative to each other.

The display device DD may include a display panel DP. In an embodiment, although not shown in the figures, the display device DD may further include a window (not shown) disposed on the display panel DP. The window (not shown) may protect the display panel DP and may provide an input surface to the user. In addition, in an embodiment, an optical member (not shown) may be further disposed on the display panel DP. The optical member (not shown) may be, but is not limited to, a polarizing layer or a color filter layer that blocks an external light or reduces a reflectance.

The display panel DP may generate an image and may provide the generated image to a front surface thereof. The display panel DP may provide the generated image in a direction of the third directional axis DR3.

The display panel DP of the display device DD may be a light emitting type display panel. For example, the display panel DP may be an organic electroluminescent display panel or a quantum dot light emitting display panel; however, embodiments are not limited thereto or thereby.

In an embodiment, the display panel DP may be a rigid display panel. In addition, the display panel DP may be a flexible display panel according to another example embodiment. The display panel DP may include a flexible substrate. In the following descriptions, the term "flexible" as used herein may mean having bendable characteristics, but is not limited only to a structure that is curved to be completely folded, and the term "flexible" may mean a structure that is bent at a level of several nanometers (nm).

Referring to FIG. 2A, the display panel DP of the display device DD may include a base substrate BS, a pixel definition layer PDL, a plurality of light emitting elements OEL1, OEL2, and OEL3, and a sealing layer SL.

The base substrate BS may be a substrate that provides a base surface on which the display panel DP is disposed. The base substrate BS may be a glass substrate, a metal substrate, or a plastic substrate; however, it is not limited thereto or thereby. The base substrate BS may include an inorganic layer, an organic layer, or a composite material layer.

Although not shown in the figures, the base substrate BS may include a circuit layer (not shown) and an insulating layer (not shown). In addition, although not shown in figures, the circuit layer (not shown) may include a gate insulating layer (not shown) and an insulating interlayer (not shown).

The pixel definition layer PDL may be formed of a polymer resin. For example, the pixel definition layer PDL may include a polyacrylate-based resin or a polyimide-based resin. In an embodiment, the pixel definition layer PDL may further include an inorganic material in addition to the polymer resin. The pixel definition layer PDL may be formed of a light absorbing material or may be formed of a black pigment or a black dye. In an embodiment, the pixel definition layer PDL may be formed of an inorganic material. For example, the pixel definition layer PDL may include silicon nitride ($SiN_x$), silicon oxide ($SiO_x$), or silicon oxynitride ($SiO_xN_y$).

The light emitting elements OEL1, OEL2, and OEL3 distinguished from each other by the pixel definition layer PDL may emit lights having different wavelengths from each other; however, they are not limited thereto or thereby. In an embodiment, the light emitting elements OEL1, OEL2, and OEL3 spaced apart from each other may emit lights having substantially the same wavelength or at least one of the lights emitted from the light emitting elements OEL1, OEL2, and OEL3 may have a wavelength different from the others.

The display panel DP may include a plurality of pixel areas PXA-R, PXA-B, and PXA-G. For example, the display panel DP may include a first pixel area PXA-R, a second pixel area PXA-B, and a third pixel area PXA-G, which emit lights having different wavelengths from each other.

In an example embodiment of the present disclosure, the first pixel area PXA-R may be a red pixel area, the second pixel area PXA-B may be a blue pixel area, and the third pixel area PXA-G may be a green pixel area. For example, the red pixel area is a red light emitting area that emits a red light, and the blue pixel area and the green pixel area are respectively a blue light emitting area and a green light emitting area.

The first pixel area PXA-R may be an area in which the first light emitting element OEL1 including a first organic layer OL1 is disposed, and the second pixel area PXA-B and the third pixel area PXA-G may be areas in which the second light emitting element OEL2 and the third light emitting element OEL3 are disposed, respectively.

Referring to FIG. 2B, the first light emitting element OEL1 may include a first sub-electrode EL11, the first organic layer OL1, and a first sub-common electrode EL21. In an embodiment, the first organic layer OL1 may include a hole transport region HTR, a light emitting layer EML, and an electron transport region ETR, which are stacked one on another. For example, the first organic layer OL1 may include the light emitting layer that emits the red light.

Although not shown in FIG. 2B, the same descriptions as those of the first light emitting element OEL1 may be applied to the second light emitting element OEL2 and the third light emitting element OEL3.

The second light emitting element OEL2 may include a second sub-electrode EL12, a second organic layer OL2, and a second sub-common electrode EL22, and the third light emitting element OEL3 may include a third sub-electrode EL13, a third organic layer OL3, and a third sub-common electrode EL23.

The second organic layer OL2 and the third organic layer OL3 may include the light emitting layers respectively emitting the blue light and the green light. In an embodiment, each of the second organic layer OL2 and the third organic layer OL3 may include the hole transport region HTR, the light emitting layer EML, and the electron transport region ETR as described above with reference to the first light emitting element OEL1.

In an embodiment, the first sub-common electrode EL21 to the third sub-common electrode EL23 may be provided in one layer.

FIG. 2A shows the organic layers OL1, OL2, and OL3 disposed in openings OOP (refer to FIG. 5B) defined in the pixel definition layer PDL; however, they are not limited thereto or thereby.

For example, light emitting layers EML of the organic layers OL1, OL2, and OL3 may be disposed in the openings OOP (refer to FIG. 5B) defined by the pixel definition layer PDL, and the hole transport region HTR and the electron transport region ETR may be provided as a common layer on the openings OOP (refer to FIG. 5B) and the pixel definition layer PDL.

In an example embodiment, each of the first, second, and third light emitting elements OEL1, OEL2, and OEL3 may emit a light having a specific color, for example, one of the red light, the blue light, and the green light; however, the color of light is not limited thereto or thereby. For example, any of a white light, a cyan light, a magenta light, and a yellow light may be used as the color of light.

In addition, according to an example embodiment, the first, second, and third light emitting elements OEL1, OEL2, and OEL3 may emit the lights having a same wavelength range as each other. In an example embodiment, each of the first, second, and third light emitting elements OEL1, OEL2, and OEL3 may include a plurality of light emitting layers stacked one on another in a direction of the third directional axis DR3, i.e., the thickness direction. In this case, the light emitting layers may emit lights having different wavelength ranges from each other, two or more light emitting layers may emit lights having different wavelength ranges from each other, or all the light emitting layers may emit the lights having the same wavelength range as each other.

The first sub-electrode EL11 of the first light emitting element OEL1 may include a metal alloy or a conductive compound. The first sub-electrode EL11 may be an anode. In addition, the first sub-electrode EL11 may be a pixel electrode. The first sub-electrode EL11 may be a transmission type electrode or a semi-transmission type electrode. In an embodiment, when the first sub-electrode EL11 is the semi-transmission type electrode or a reflection type electrode, the first sub-electrode EL11 may include Ag, Mg, Cu, Al, Pt, Pd, Au, Ni, Nd, Ir, Cr, Li, Ca, LiF/Ca, LiF/Al, Mo, Ti, or a compound thereof or a mixture (e.g., a mixture of Ag and Mg) thereof. In an embodiment, the first sub-electrode EL11 may have a multi-layer structure of a reflection layer or a semi-transmission layer that is formed of any of the above-mentioned materials and a transparent conductive layer formed of indium tin oxide (ITO), indium zinc oxide (IZO), zinc oxide (ZnO), or indium tin zinc oxide (ITZO).

At least one organic layer OL1 may be disposed on the first sub-electrode EL11. In an embodiment, the first light emitting element OEL1 may include the hole transport region HTR disposed on the first sub-electrode EL11, the light emitting layer EML disposed on the hole transport region HTR, and the electron transport region ETR disposed on the light emitting layer EML.

The hole transport region HTR may have a single-layer structure of a single material, a single-layer structure of plural different materials from each other, or a multi-layer structure of plural layers formed of different materials from each other. For example, the hole transport region HTR may have a single-layer structure of different materials from each other or a multi-layer structure of a hole injection layer/a hole transport layer, a hole injection layer/a hole transport layer/a buffer layer, a hole injection layer/a buffer layer, a hole transport layer/a buffer layer, or a hole injection layer/a hole transport layer/an electron stop layer, which are sequentially stacked on the first sub-electrode EL11; however, embodiments are not limited thereto or thereby.

For example, although not shown in figures, the hole transport region HTR may include the hole injection layer and the hole transport layer, and a well-known hole injection material and a well-known hole transport material may be used for the hole injection layer and the hole transport layer, respectively.

The light emitting layer EML may be disposed on the hole transport region HTR. The light emitting layer EML may have a single-layer structure of a single material, a single-layer structure of plural different materials from each other, or a multi-layer structure of plural layers formed of different materials from each other.

In an embodiment, when the display panel DP is the organic electroluminescent display panel, the light emitting layer EML may include a host and a dopant. As a material for the host, the light emitting layer EML may include at least one of DPEPO(Bis[2-(diphenylphosphino)phenyl] ether oxide), CBP(4,4'-Bis(carbazol-9-yl)biphenyl), mCP(1, 3-Bis(carbazol-9-yl) benzene), PPF(2,8-Bis(diphenylphosphoryl)dibenzo [b, d]furan), TcTa(4,4',4"-Tris (carbazol-9-yl)-triphenylamine), and TPBi(1,3,5-tris(N-phenylbenzimidazole-2-yl)benzene); however, it is not limited thereto or thereby.

In addition, as a material for the dopant, the light emitting layer EML may include styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene(DPAVB), N-(4-((E)-2-(6-((E)-4-(diphenylamino)styryl)naphthalen-2-yl) vinyl)phenyl)-N-phenylbenzenamine(N-BDAVBi)), perylene and its derivatives (e.g., 2,5,8,11-Tetra-t-butylperylene(TBP)), pyrene and its derivatives (e.g., 1,1-dipyrene, 1,4-dipyrenylbenzene, 1,4-Bis(N,N-Diphenylamino)pyrene); however, it is not limited thereto or thereby.

In an embodiment, when the display panel DP is the quantum dot light emitting display panel, the display panel DP may include quantum dots distributed in the light emitting layer EML. In an embodiment, a core of each quantum dot may be selected from Group II-VI compounds, Group III-V compounds, Group IV-VI compounds, Group IV elements, Group IV compounds, and combinations thereof.

The Group II-VI compounds may be compounds selected from the group consisting of CdSe, CdTe, ZnS, ZnSe, ZnTe, ZnO, HgS, HgSe, HgTe, MgSe, MgS and mixtures thereof.

The Group III-V compounds may be compounds selected from the group consisting of GaN, GaP, GaAs, GaSb, AlN, AlP, AlAs, AlSb, InN, InP, InAs, InSb, and mixtures thereof.

The Group IV-VI compounds may be compounds selected from the group consisting of SnS, SnSe, SnTe, PbS, PbSe, PbTe and mixtures thereof.

In an embodiment, the quantum dot may have a core-shell structure in which one quantum dot surrounds another quantum dot. An interface between the core and the shell may have a concentration gradient in which a concentration of elements present in the shell becomes lower toward a center of the core.

In some embodiments, the quantum dot may have a core-shell structure including a core having nanocrystals and a shell surrounding the core. The shell of the quantum dot may act as a protective layer to maintain semiconductor properties by preventing or substantially preventing chemical modification of the core and/or as a charging layer to give electrophoretic characteristics to the quantum dots. The shell may have a single-layer structure or a multi-layer structure. As an example of the shell of the quantum dots, oxides of metals or nonmetals, semiconductor compounds, or combinations thereof may be used.

In an embodiment, the quantum dot may have a full width of half maximum (FWHM) of a light emission wavelength spectrum equal to or smaller than about 45 nm, and, in an embodiment, about 40 nm, and, in an embodiment, about 30 nm, and may improve a color purity or a color reproducibility within the range. In addition, since the light emitted through the quantum dot travels in all directions (360 degrees), a wide viewing angle may be improved.

In addition, a shape of the quantum dot is not particularly limited and may be commonly used in the art, and, in some embodiments, the quantum dots may have a spherical shape, a pyramid shape, a multi-arm shape, a cubic nanoparticle, a nanotube, a nanowire, a nanofiber, or a nanoplate particle.

The color of the light emitted from the quantum dots may be changed depending on a size of particles of the quantum dots, and, thus, the quantum dots may have various light emission colors, such as a blue color, a red color, or a green color.

The electron transport region ETR may be disposed on the light emitting layer EML. Although not shown in figures, the electron transport region ETR may include at least one of a hole stop layer, the electron transport layer, and the electron injection layer; however, it is not limited thereto or thereby. When the electron transport region ETR includes the electron injection layer and the electron transport layer, a well-known electron injection material and a well-known electron transport material may be used for the electron injection layer and the electron transport layer, respectively. When the electron transport region ETR includes the electron injection layer and the electron transport layer, the electron transport layer may be disposed on the light emitting layer EML, and the electron injection layer may be disposed on the electron transport layer.

The first sub-common electrode EL21 may be disposed on the electron transport region ETR. The first sub-common electrode EL21 may be a common electrode or a cathode. The first sub-common electrode EL21 may be formed of a metal alloy or a conductive compound. The first sub-common electrode EL21 may be a transmission type electrode, a semi-transmission type electrode, or a reflection type electrode. When the first sub-common electrode EL21 is the transmission type electrode, the first sub-common electrode EL21 may include a transparent metal oxide, e.g., indium tin oxide (ITO), indium zinc oxide (IZO), zinc oxide (ZnO), or indium tin zinc oxide (ITZO).

In an embodiment, when the first sub-common electrode EL21 is the semi-transmission type electrode or the reflection type electrode, the first sub-common electrode EL21 may include Ag, Mg, Cu, Al, Pt, Pd, Au, Ni, Nd, Ir, Cr, Li, Ca, LiF/Ca, LiF/Al, Mo, Ti, or a compound thereof, or a mixture (e.g., a mixture of Ag and Mg) thereof. In an embodiment, the first sub-common electrode EL21 may have a multi-layer structure of a reflection layer or a semi-transmission layer that is formed of any of the above-mentioned materials and a transparent conductive layer formed of indium tin oxide (ITO), indium zinc oxide (IZO), zinc oxide (ZnO), or indium tin zinc oxide (ITZO).

In addition, the second light emitting element OEL2 may include the second sub-electrode EL12, the second organic layer OL2, and the second sub-common electrode EL22, and the third light emitting element OEL3 may include the third sub-electrode EL13, the third organic layer OL3, and the third sub-common electrode EL23.

The same descriptions as those of the first sub-electrode EL11 may be applied to the second sub-electrode EL12 and the third sub-electrode EL13.

The descriptions of the first sub-common electrode EL21 may be applied to the second sub-common electrode EL22 and the third sub-common electrode EL23.

The second organic layer OL2 may include the hole transport region HTR disposed on the second sub-electrode EL12, the light emitting layer EML disposed on the hole transport region HTR, and the electron transport region ETR disposed on the light emitting layer EML. The third organic layer OL3 may include the hole transport region HTR disposed on the third sub-electrode EL13, the light emitting layer EML disposed on the hole transport region HTR, and the electron transport region ETR disposed on the light emitting layer EML.

In an embodiment, the light emitting layers included in the first, second, and third light emitting elements OEL1, OEL2, and OEL3 may emit the lights having different wavelength ranges from each other. The same descriptions as those of the first light emitting element OEL1 may be applied to the second light emitting element OEL2 and the third light emitting element OEL3.

Herein, in a method of manufacturing the display device according to an example embodiment of the present disclosure, the first to third sub-electrodes will be described as a first electrode, and the first to third sub-common electrodes will be described as a second electrode.

The sealing layer SL may cover the light emitting elements OEL1, OEL2, and OEL3. In an embodiment, the sealing layer SL may be directly disposed on the first sub-common electrode EL21 to the third sub-common electrode EL23. The sealing layer SL may have a single-layer structure or a multi-layer structure of layers stacked one on another. The sealing layer SL may be a thin film sealing layer. The sealing layer SL may protect the light emitting elements OEL1, OEL2, and OEL3. The sealing layer SL may cover an upper surface of the first sub-common electrode EL21 to the third sub-common electrode EL23.

FIG. 3 is a view schematically showing the self-assembled monolayer SAM. The self-assembled monolayer SAM corresponds to a material used to form an organic molecular thin film OB that is provided to pattern an organic layer in the manufacturing method of the display device described later. The self-assembled monolayer SAM according to an embodiment may include a head group HD, a spacer group SP, and a terminal group MD.

The head group HD may be adsorbed to the first electrode EL11, EL12, and EL13 and the pixel definition layer PDL. In an embodiment, when the head group HD is adsorbed to the first electrode EL11, EL12, and EL13, the head group HD may include a substituted or unsubstituted siloxane group or a substituted or unsubstituted acrylate group. For example, the head group HD may be the substituted siloxane group. The head group HD may become siloxane to be coupled to the first electrode EL11, EL12, and EL13.

Meanwhile, van der Waals force may act between the head group HD and the pixel definition layer PDL. That is, the head group HD may be adsorbed to the pixel definition layer PDL by van der Waals force rather than chemical bonding to the pixel definition layer PDL.

In the present disclosure, "substituted or unsubstituted" may mean unsubstituted or substituted with one or more substituents selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents described above may be substituted or unsubstituted. For example, a biphenyl group may be interpreted as the aryl group or may be interpreted as a phenyl group substituted with a phenyl group.

The spacer group SP may be disposed between the head group HD and the terminal group MD. In an embodiment, the spacer group SP may include four or more and twenty-five or less $CF_2$ groups, for example, twenty-one $CF_2$ groups.

The terminal group MD may be exposed outside the surface of the organic molecular thin film OB. In an embodiment, the terminal group MD may include a $CF_3$ group.

For example, the self-assembled monolayer SAM may be independently represented by any of the following S1 to S6. However, S1 to S6 are examples, and embodiments are not limited thereto.

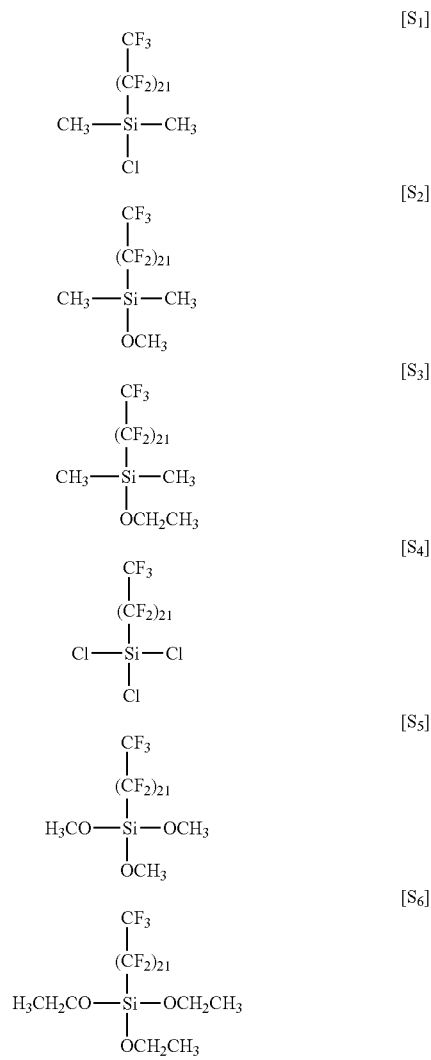

In an embodiment, the head group HD may be a substituted or unsubstituted silyl group in S1 to S6. When the head group HD is adsorbed to the first electrode, at least one of the substituents of Si may be substituted with O to form a siloxane group. When the head group HD is adsorbed to the pixel definition layer PDL, the head group HD may be adsorbed by van der Waals force.

In an embodiment, in S1 to S6, the spacer group SP may be *—$(CF_2)_{21}$—*. The terminal group MD may be *—$CF_3$.

Figure 5A:
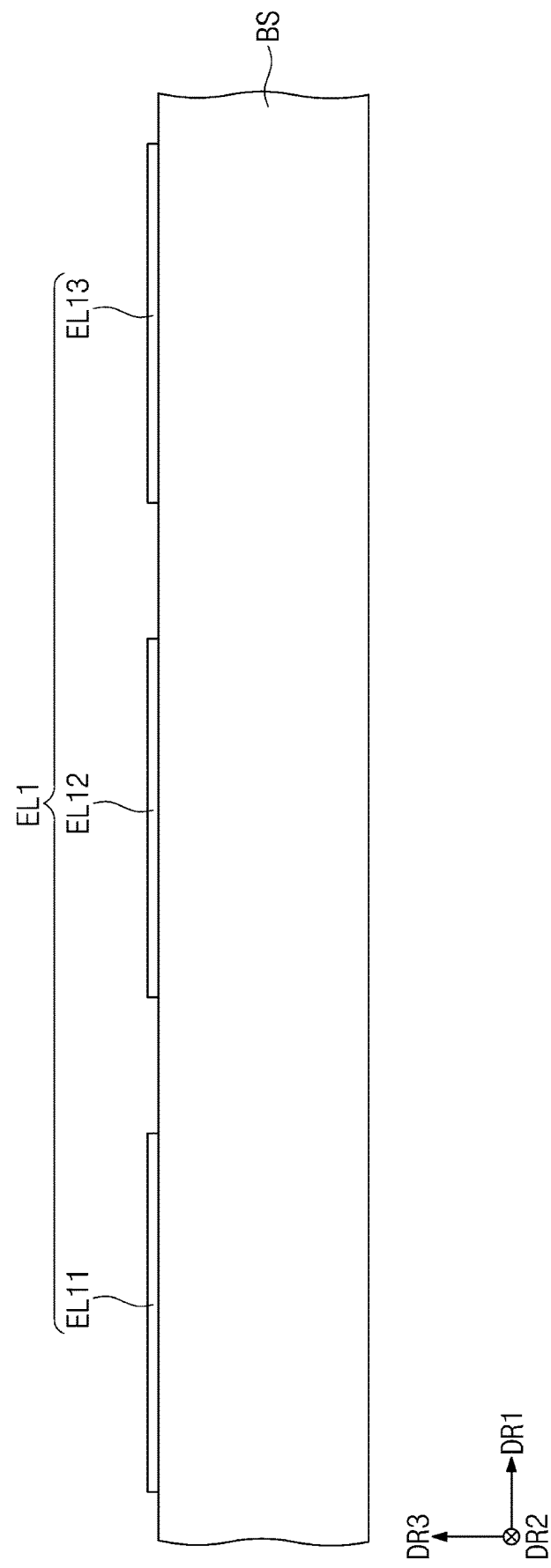
FIGS. 5A to 5O are views showing a method of manufacturing a display device according to an example embodiment of the present disclosure.

FIG. 4 is a flowchart showing a method of manufacturing a display device according to an example embodiment of the present disclosure; and FIGS. 5A to 5O are views sequentially showing a method of manufacturing a display device according to an example embodiment of the present disclosure.

Referring to FIGS. 4 and 5A to 5O, a manufacturing method of a display device includes forming a first electrode EL1 on the base substrate BS (S100), forming the pixel definition layer PDL through which the openings OOP are defined (S200), providing the organic molecular thin film OB on the first electrode EL1 and the pixel definition layer PDL (S300), desorbing a portion of the organic molecular thin film OB corresponding to the openings OOP (S400), and providing at least one organic layer OL1, OL2, and OL3 on the first electrode EL1 (S500).

The first electrode EL1 may refer to the first sub-electrode EL11 to the third sub-electrode EL13, and the first electrode EL1 may be in order of the first sub-electrode EL11, the second sub-electrode EL12, and the third sub-electrode EL13, which may be interpreted as corresponding to a process order. At least one organic layer OL1, OL2, and OL3 may be interpreted as the first organic layer OL1 to the third organic layer OL3.

The forming of the first electrode EL1 on the base substrate BS (S100) may be forming the first to third sub-electrodes on the base substrate BS to be spaced apart from each other.

The forming of the pixel definition layer PDL (S200) may be forming the pixel definition layer PDL through which the openings OOP are defined to expose the upper surface of the first electrode EL1 on the base substrate BS.

Figure 5C:
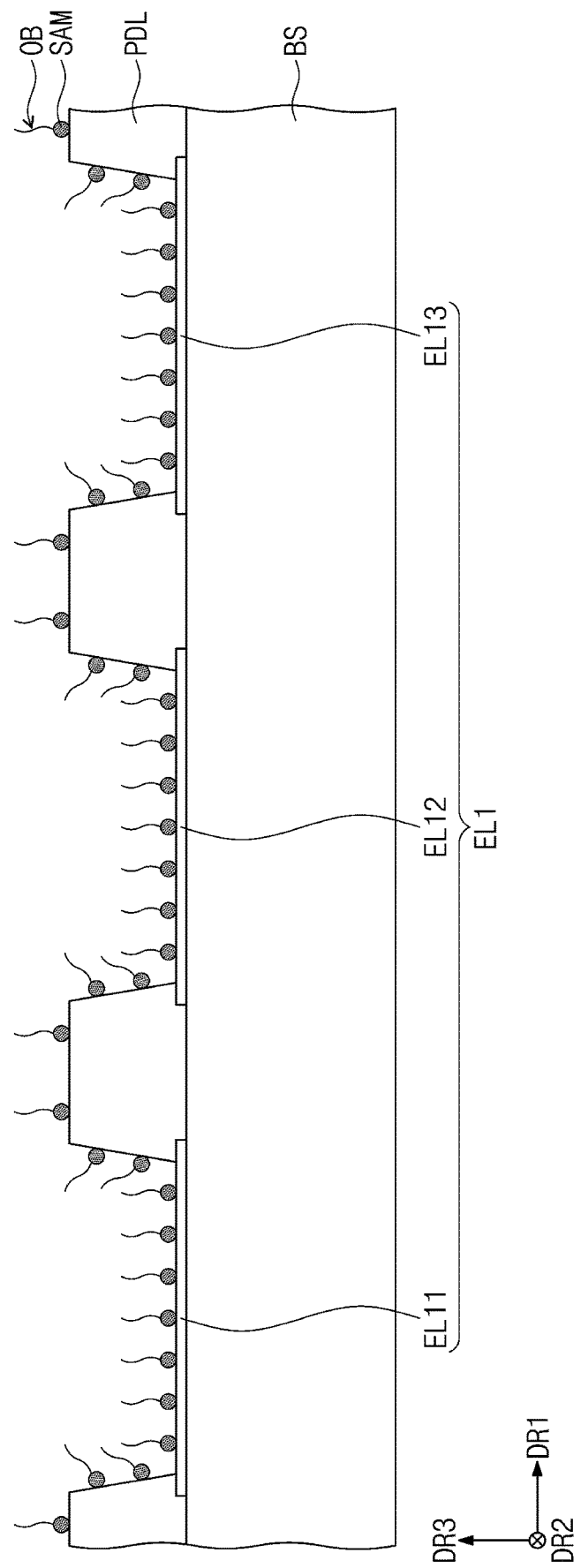

FIG. 5C shows an operation (S300) of providing the organic molecular thin film OB on the first electrode EL1 and the pixel definition layer PDL. The organic molecular thin film OB may be formed by providing the self-assembled monolayer SAM on the first electrode EL1 and the pixel definition layer PDL.

The head group HD of the self-assembled monolayer SAM may be adsorbed to the first electrode EL11, EL12, and EL13 and the pixel definition layer PDL in the organic molecular thin film OB. The terminal group MD of the self-assembled monolayer SAM may form an outermost layer of the organic molecular thin film OB.

The organic molecular thin film OB may be formed by depositing the self-assembled monolayer SAM on the base substrate BS by thermal evaporation, chemical vapor deposition, or electron beam evaporation.

For example, the thermal evaporation may be carried out in a vacuum chamber. The self-assembled monolayer SAM is disposed on a material providing unit and the material providing unit is heated. Accordingly, the self-assembled monolayer SAM is heated and evaporated. The self-assembled monolayer SAM is deposited on the first electrode EL1 and the pixel definition layer PDL, and the organic molecular thin film OB is formed.

For example, in the chemical vapor deposition (CVD), pyrolysis, photolysis, or redox reaction may be performed on the self-assembled monolayer SAM to deposit the self-assembled monolayer SAM on the first electrode EL1 or the pixel definition layer PDL. The self-assembled monolayer SAM may be deposited on the first electrode EL1 and the pixel definition layer PDL, and the organic molecular thin film OB may be formed.

For example, an electron beam may be irradiated to the self-assembled monolayer SAM in the electron beam evaporation. The self-assembled monolayer SAM is heated and evaporated by the electron beam. The self-assembled monolayer SAM may be deposited on the first electrode EL1 and the pixel definition layer PDL, and the organic molecular thin film OB may be formed.

Figure 5D:
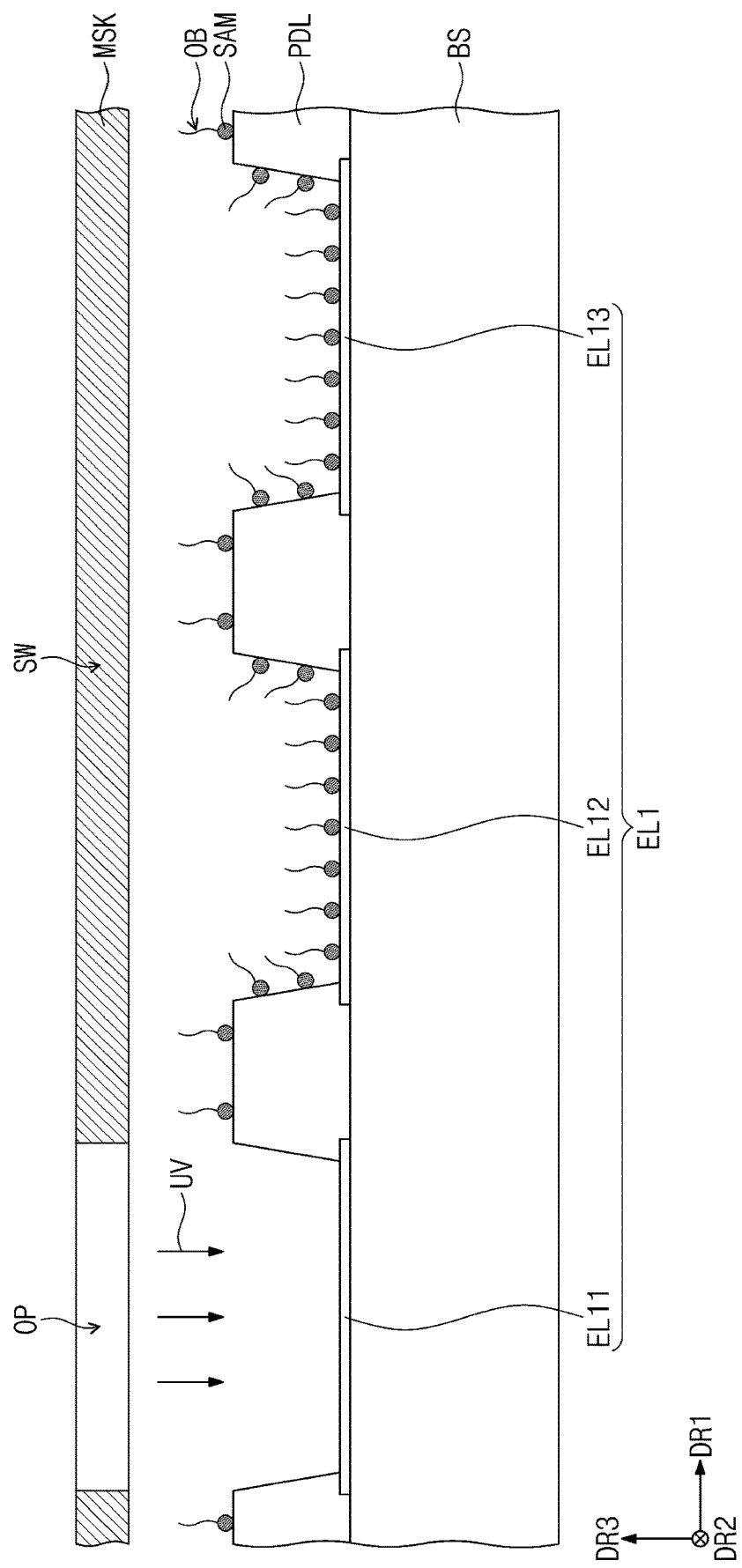

FIG. 5D shows the desorbing of the portion of the organic molecular thin film corresponding to the openings OOP (S400). In the desorbing (S400) of the portion of the organic molecular thin film OB corresponding to the openings OOP, the portion of the organic molecular thin film OB corresponding to the openings OOP may be desorbed using a mask MSK in which an open area OP and a shadow area SW are defined. For example, the organic molecular thin film OB disposed to correspond to the open area OP of the mask MSK may be desorbed by a UV treatment or plasma treatment.

For example, in the case of the UV treatment, the organic molecular thin film OB may be decomposed and desorbed by using a short wavelength of about 250 nm or less. In an embodiment, a UV of about 250 nm wavelength may be used on a vacuum condition. In an embodiment, the UV wavelength during the vacuum UV treatment may be the short wavelength UV of about 200 nm or less. In the case of the UV treatment method, a surface damage may be less since no fast ions are generated when compared with the plasma treatment described later.

In the case of the plasma treatment, the surface may be cleaned with a plasma formed by injecting gases such as $O_2$, Ar, or $N_2$. In an embodiment, in the case of desorption of the organic molecular thin film OB, an $O_2$ plasma may be used.

The organic molecular thin film OB disposed under the shadow area SW of the mask MSK may remain without desorption because it is not UV treated or plasma treated.

When the organic molecular thin film OB is formed by the self-assembled monolayer SAM, wetting or adsorption of the organic layer having a higher surface energy than the self-assembled monolayer SAM on the organic molecular thin film OB may be difficult. Therefore, it is not easy to form the organic layer on the organic molecular thin film OB formed of the self-assembled monolayer SAM. Thus, the organic molecular thin film OB formed of the self-assembled monolayer SAM may act as a mask when forming the organic layer to enable patterning of the organic layer.

Figure 5E:
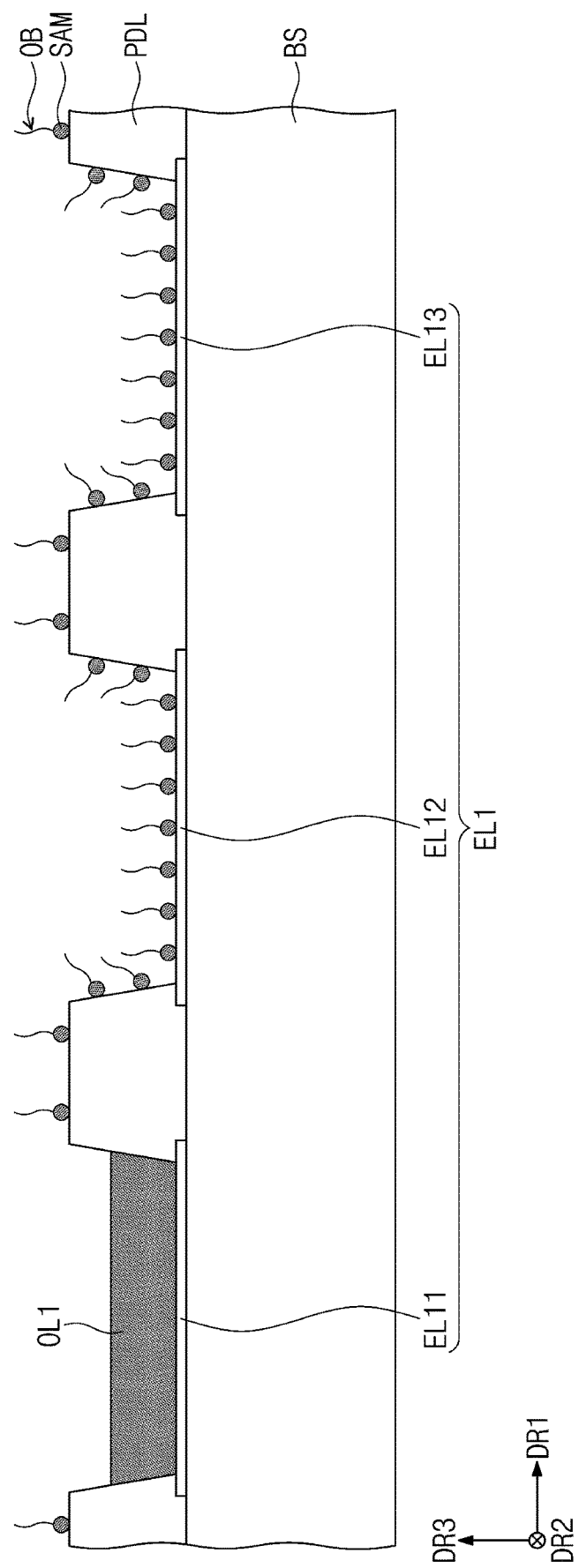

FIG. 5E shows the providing (S500) of at least one organic layer OL1 on the first electrode EL1. In operation S500, the at least one organic layer OL1 is disposed on the first electrode EL1 after the desorption of the portion of the organic molecular thin film OB.

For example, the at least one organic layer OL1, OL2, and OL3 may be provided by a deposition process. The at least one organic layer OL1, OL2, and OL3 may include the hole transport region HTR, the light emitting layer EML, and the electron transport region ETR, which are stacked one on another.

Meanwhile, embodiments are not limited to the above-described embodiment. In a manufacturing method of a display device according to an example embodiment, the organic layer may be provided by an inkjet printing method in operation S500 of providing the at least one organic layer OL1, OL2, and OL3 on the first electrode EL1.

The organic layer may not be formed in the area in which the self-assembled monolayer SAM remains. That is, due to a low surface energy value of the self-assembled monolayer SAM, the organic layer may not be wetted on the portion where the organic molecular thin film OB including the self-assembled monolayer SAM remains.

Figure 5F:
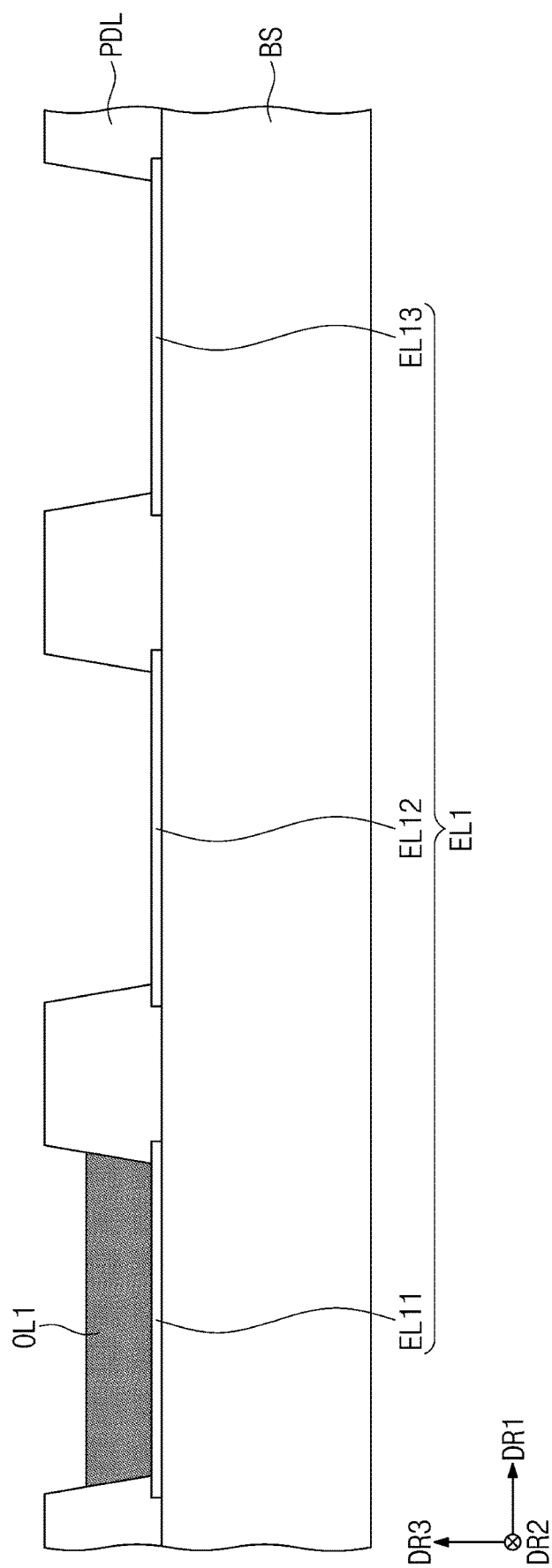

FIG. 5F shows the base substrate BS on which the organic molecular thin film OB is removed after the organic layer OL1 is formed. For example, the organic molecular thin film OB may be removed by the UV treatment or plasma treatment.

FIGS. 5G to 5M show the above-described operations that are repeated. For example, the providing of the organic molecular thin film OB on the first electrode EL1 and the pixel definition layer PDL (S300), the desorbing of the portion of the organic molecular thin film OB corresponding to the openings OOP (S400), and the providing of the at least one organic layer OL1, OL2, and OL3 on the first electrode EL1 (S500) may be repeated two more times. For example, the organic molecular thin film OB may be formed on the entire first organic layer OL1 and the pixel definition layer PDL by depositing the self-assembled monolayer SAM. At least one organic layer OL2 and OL3 may be formed after the portion of the organic molecular thin film OB is desorbing by using the mask MSK in which the open area OP and the shadow area SW are defined.

Referring to FIGS. 5N and 5O, the second electrode EL2 may be formed after the first organic layer OL1 to the third organic layer OL3 are formed. The second electrode EL2 may be, for example, the common electrode.

However, the manufacturing method of the display device is not limited to the operations shown in FIGS. 5A to 5O. For example, in a manufacturing method of the display device according to another embodiment of the present disclosure, only the organic molecular thin film OB disposed on the second sub-electrode EL12 shown in FIG. 5F may be removed, and the operations shown in FIGS. 5G and 5H may be omitted.

Figure 5G:
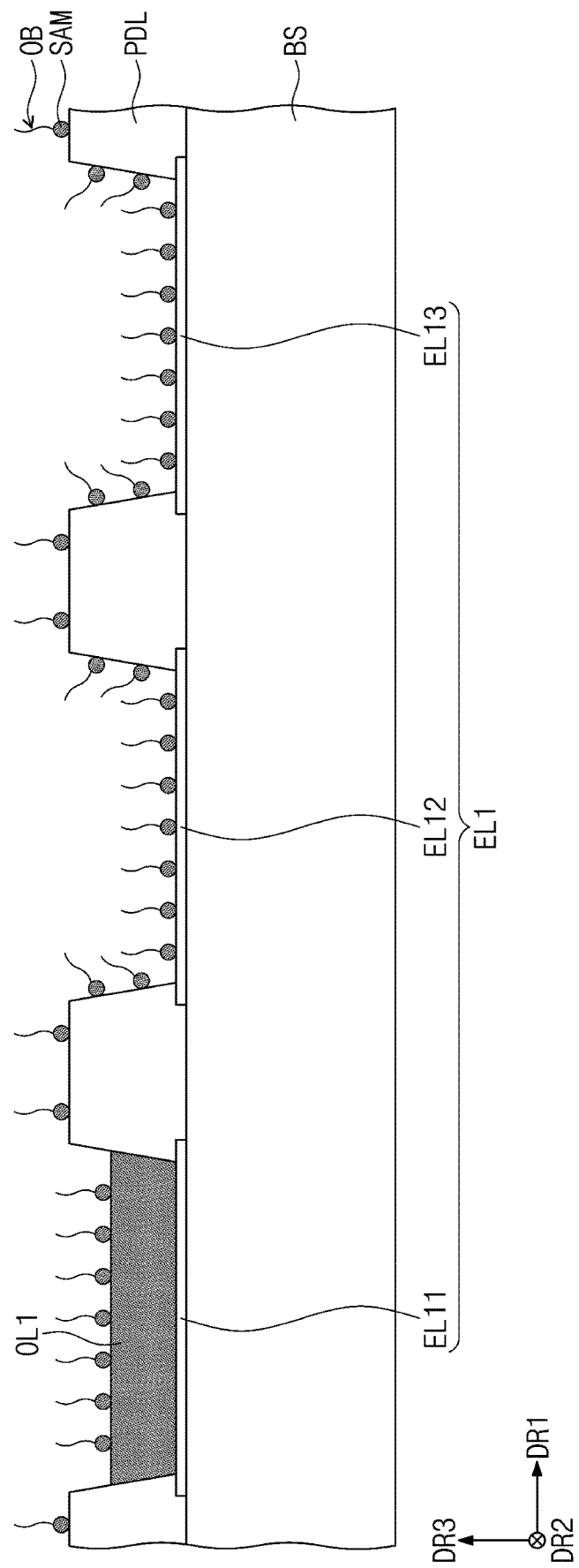
Figure 5H:
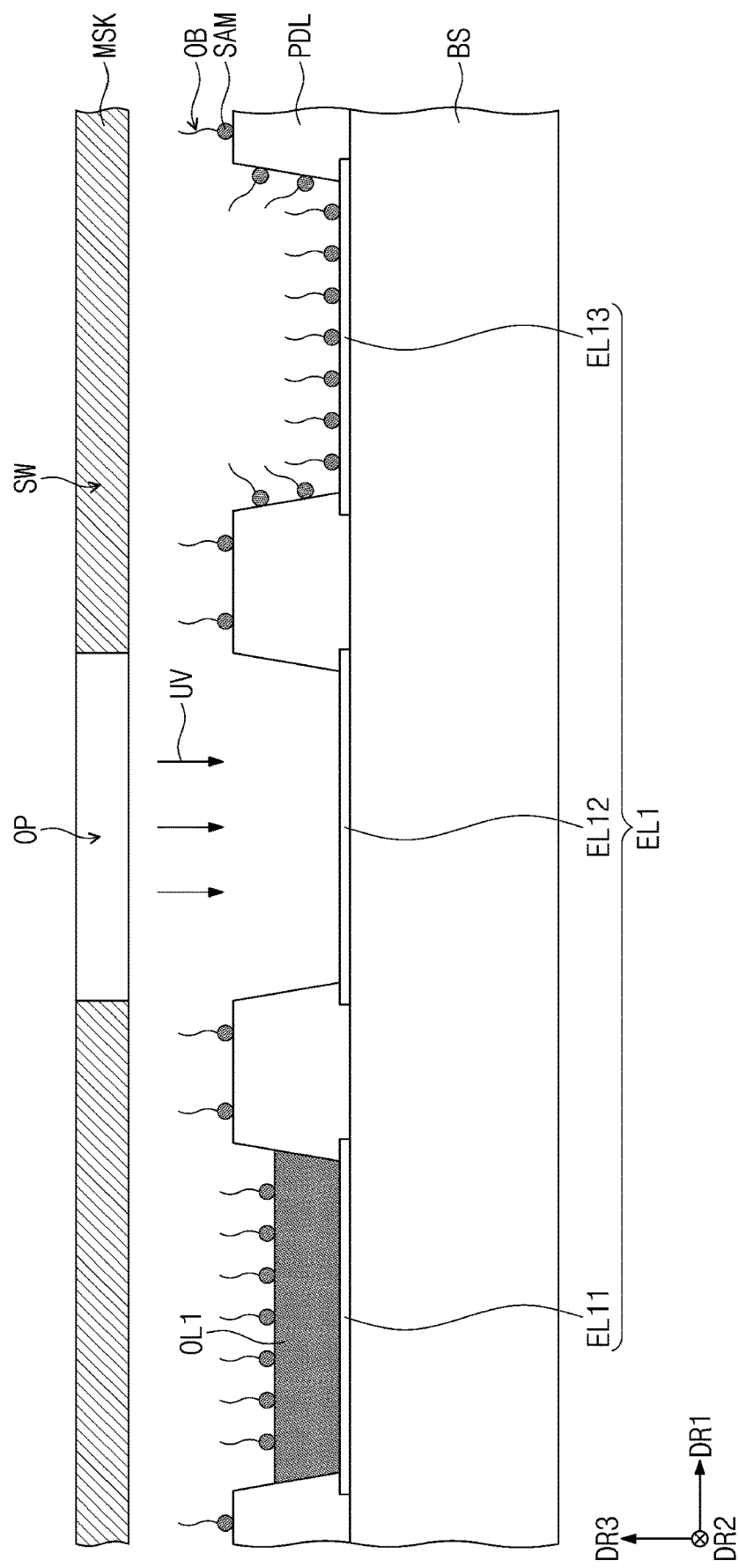
Figure 5I:
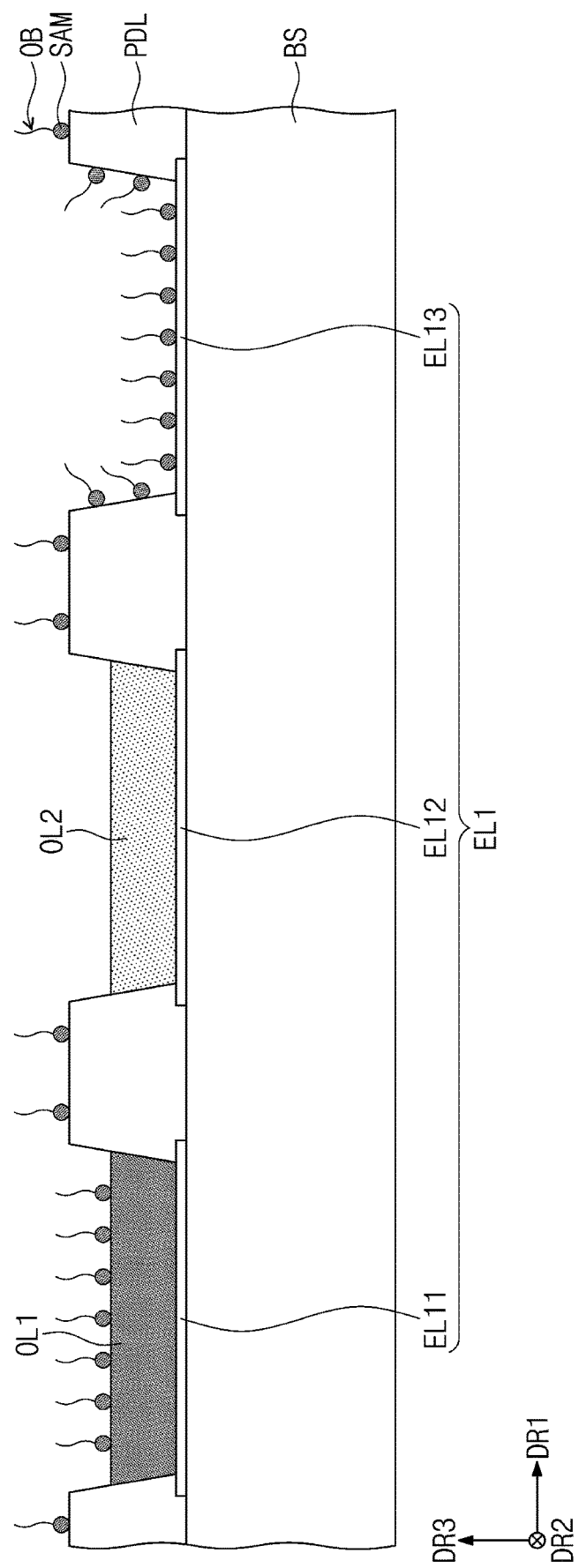
Figure 5J:
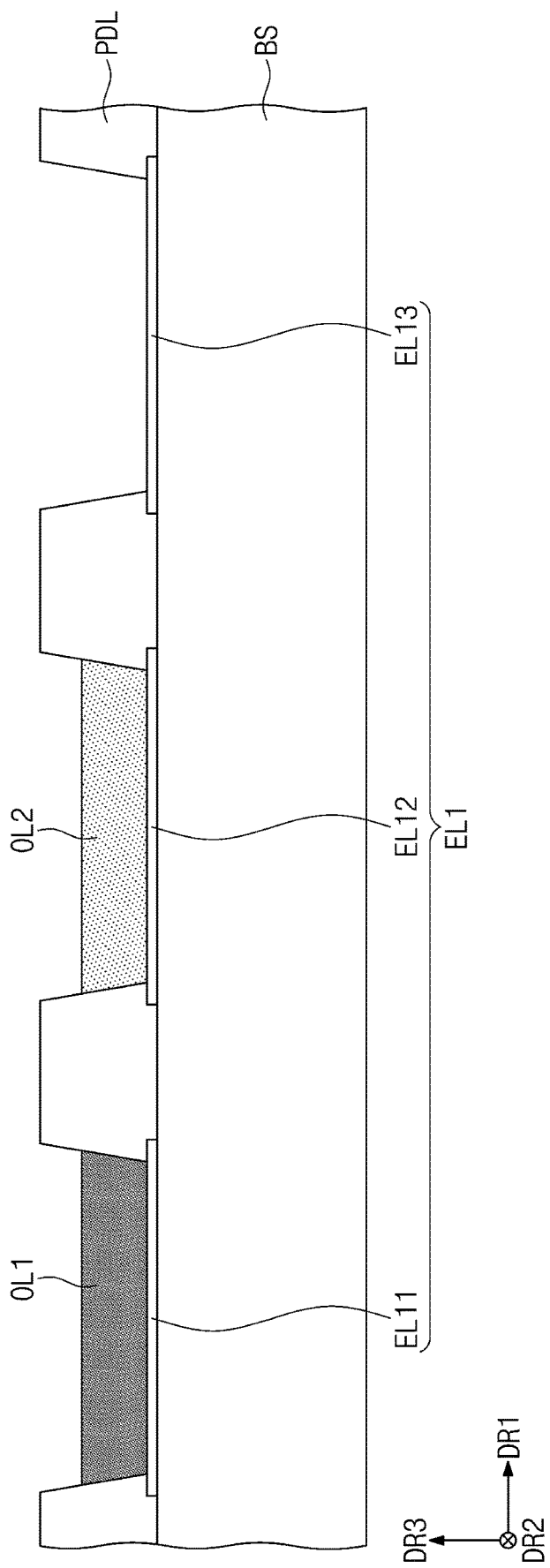
Figure 5K:
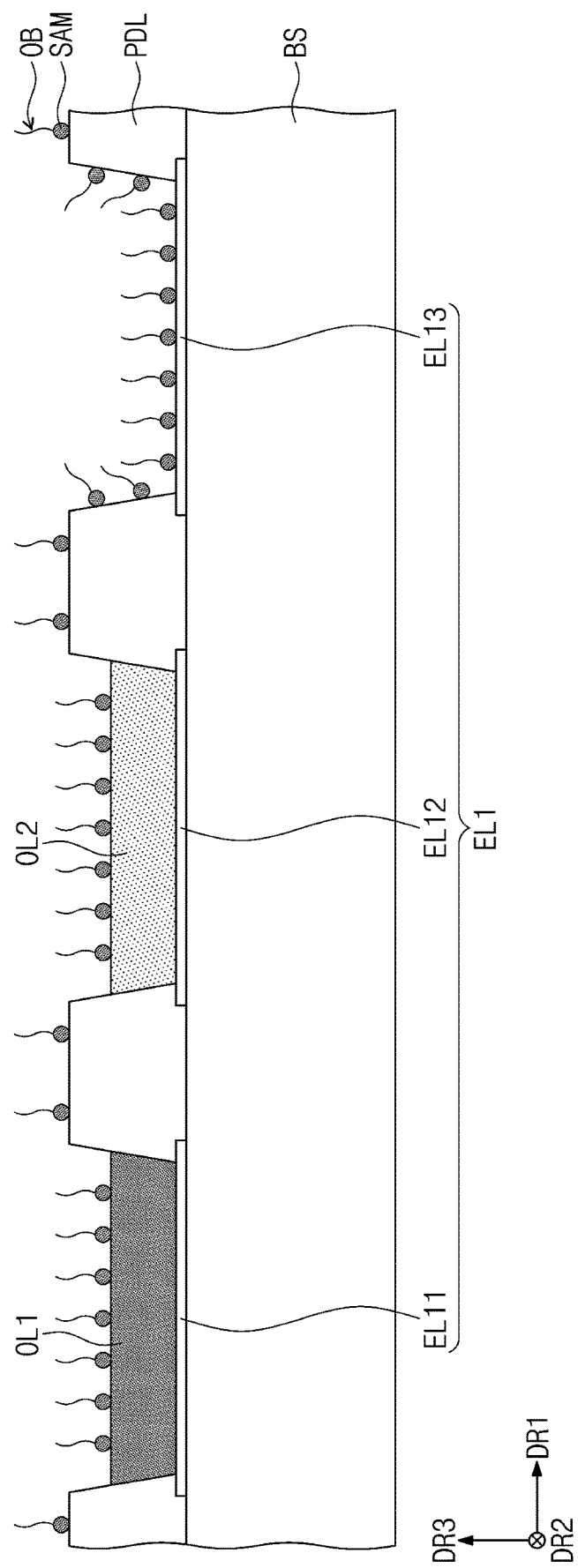
Figure 5L:
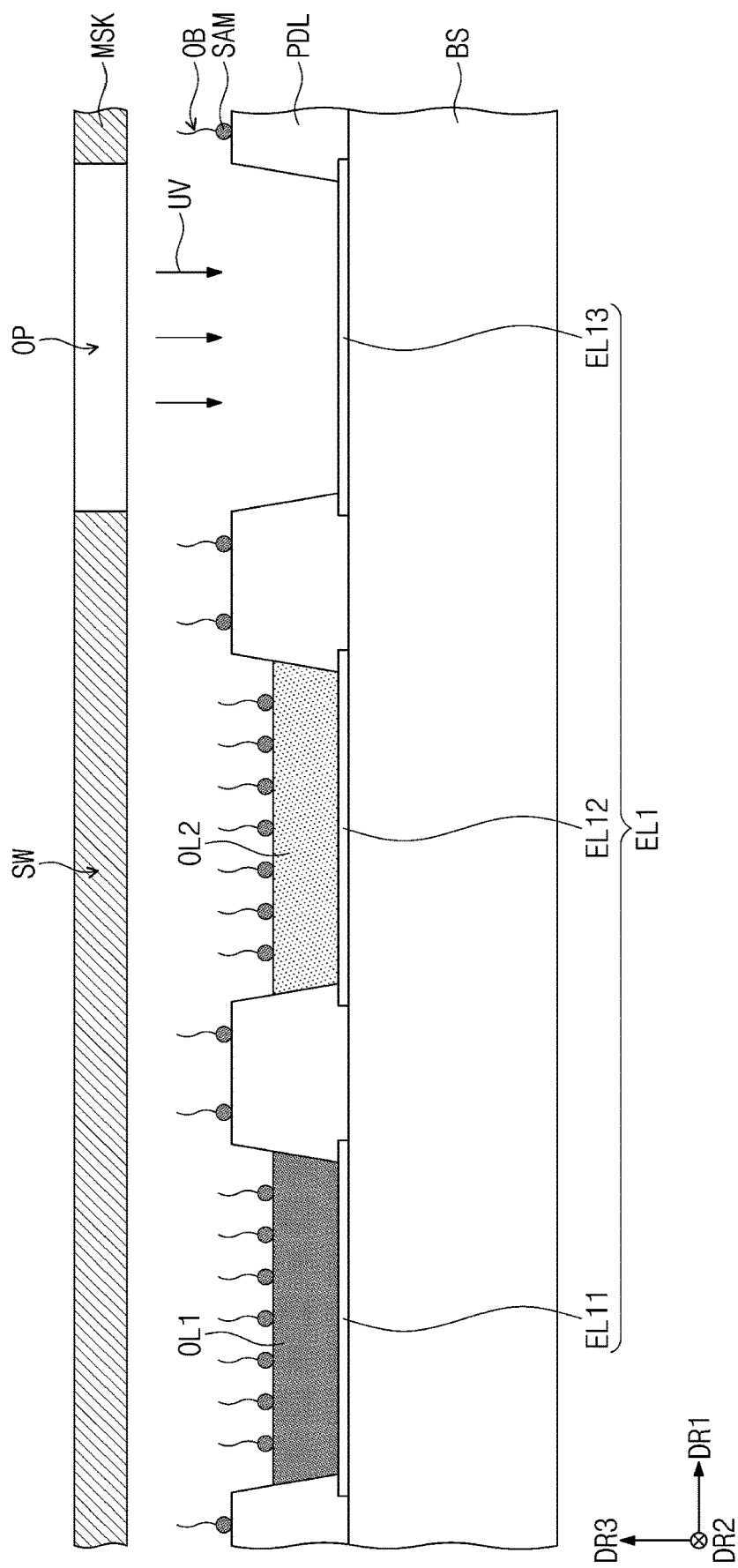
Figure 5M:
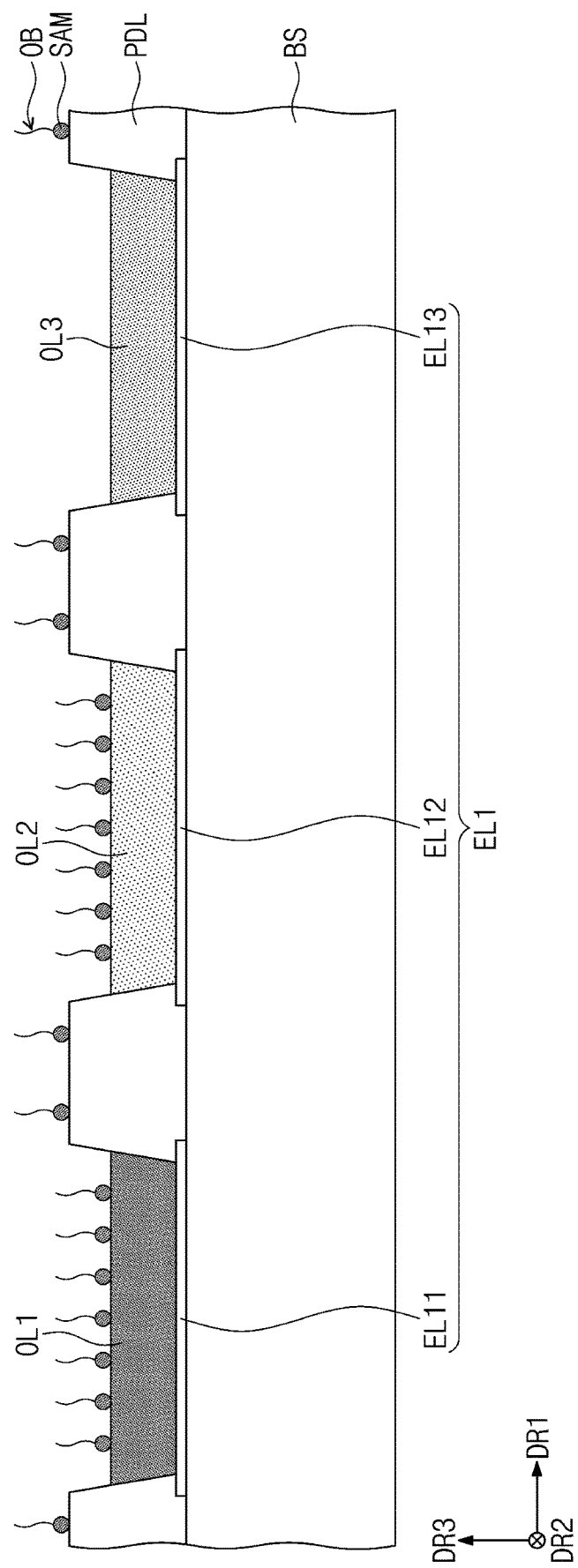
Figure 50:
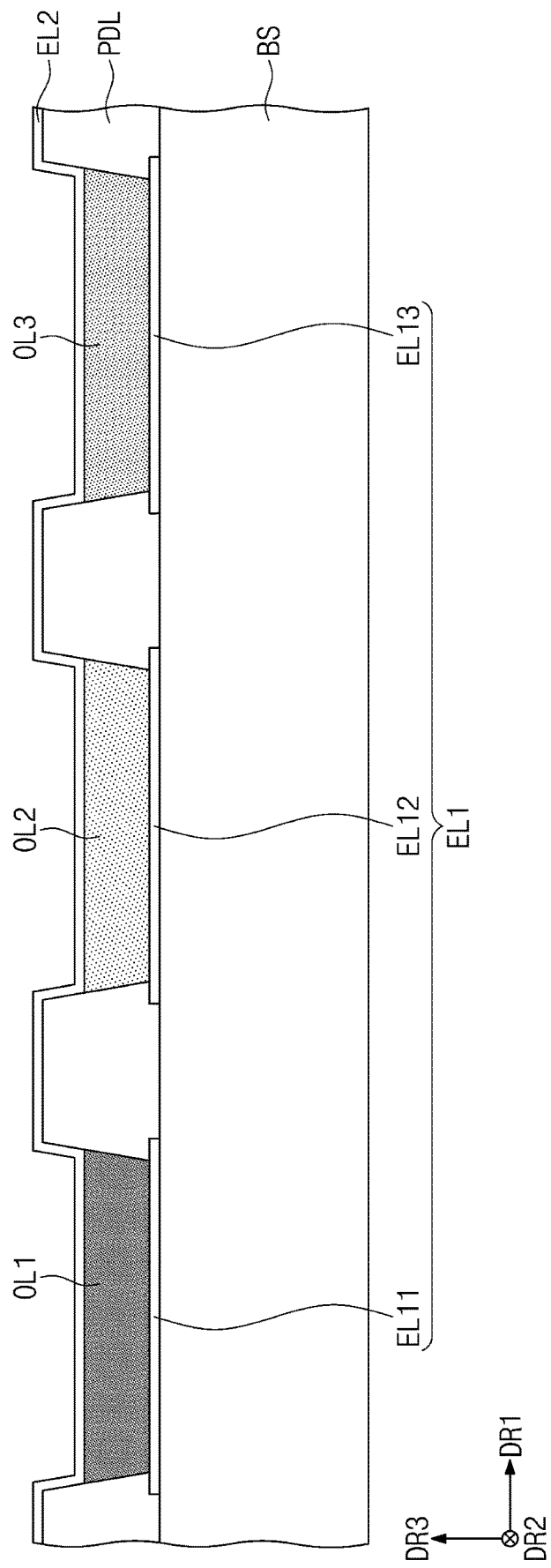

In further detail, the providing of the organic molecular thin film OB on the first electrode EL1 and the pixel definition layer PDL and the desorbing of the portion of the organic molecular thin film OB disposed on the second sub-electrode EL12 shown in FIGS. 5G and 5H to form the second organic layer OL2 may not be repeated. Instead, after forming the first organic layer OL1 as shown in FIG. 5E, only the organic molecular thin film OB disposed in the area where the second organic layer OL2 is to be formed may be removed in the operation in FIG. 5F. As a result, the number of processes may be reduced, and a process time may be shortened.

The manufacturing method of the display device according to an embodiment of the present disclosure may include forming the first electrode EL1 on the base substrate BS, forming the pixel definition layer PDL through which the openings OOP exposing an upper surface of the first electrode EL1 are defined, providing the organic molecular thin film OB including the self-assembled monolayer SAM on the first electrode EL1 and the pixel definition layer PDL, desorbing the portion of the organic molecular thin film OB corresponding to the first electrode EL1, and providing the at least one organic layer OL1 on the first electrode EL1, and, thus, the organic layer may be patterned with an ultra-high resolution.

Although some example embodiments of the present disclosure have been described, it is to be understood that the present disclosure should not be limited to these example embodiments, but various changes and modifications may be made by one ordinary skilled in the art within the spirit and scope of the present disclosure as herein claimed.

Therefore, the disclosed subject matter should not be limited to any single embodiment described herein, and the scope of the present inventive concept shall be determined according to the attached claims.

What is claimed is:

1. A method of manufacturing a display device, the method comprising:
    forming a first electrode on a base substrate;
    forming a pixel definition layer through which an opening is defined to expose an upper surface of the first electrode on the base substrate;
    providing an organic molecular thin film comprising a self-assembled monolayer on the first electrode and the pixel definition layer;
    desorbing a portion of the organic molecular thin film which corresponds to the opening; and
    providing at least one organic layer on the first electrode.

2. The method of claim 1, wherein the self-assembled monolayer comprises:
    a head group adsorbed to the first electrode and the pixel definition layer;
    a terminal group comprising a $CF_3$ group; and
    a spacer group between the head group and the terminal group and comprising four or more and twenty-five or less $CF_2$ groups.

3. The method of claim 2, wherein the head group comprises a substituted or unsubstituted siloxane group or a substituted or unsubstituted acrylate group.

4. The method of claim 1, wherein the providing of the organic molecular thin film comprises providing the self-assembled monolayer by thermal evaporation, chemical vapor deposition, or electron beam evaporation.

5. The method of claim 1, wherein the desorbing of the portion of the organic molecular thin film comprises UV or plasma treating the organic molecular thin film.

6. The method of claim 1, wherein the desorbing of the portion of the organic molecular thin film comprises providing a UV light above a mask comprising an opening area corresponding to the opening.

7. The method of claim 1, further comprising removing a remaining portion of the organic molecular thin film after the providing of the at least one organic layer on the first electrode.

8. The method of claim 7, wherein the removing of the remaining portion of the organic molecular thin film comprises UV or plasma treating the remaining portion of the organic molecular thin film.

9. The method of claim 1, wherein the at least one organic layer comprises a hole transport region, a light emitting layer, and an electron transport region, which are sequentially stacked on the first electrode.

10. The method of claim 1, wherein the providing of the at least one organic layer comprises providing the at least one organic layer by inkjet printing.

11. A method of manufacturing a display device, the method comprising:
    forming a first sub-electrode, a second sub-electrode, and a third sub-electrode, which are spaced apart from each other, on a base substrate;
    forming a pixel definition layer through which a plurality of openings is defined to expose upper surfaces of the first, second, and third sub-electrodes on the base substrate;
    providing a first organic molecular thin film comprising a self-assembled monolayer on the first, second, and third sub-electrodes and the pixel definition layer;
    desorbing a portion of the first organic molecular thin film which corresponds to an opening of the plurality of openings through which the upper surface of the first sub-electrode is exposed;
    providing a first organic layer on the first sub-electrode;
    desorbing a remaining portion of the first organic molecular thin film from the second sub-electrode, the third sub-electrode, and the pixel definition layer;
    providing a second organic molecular thin film comprising a self-assembled monolayer on the second and third sub-electrodes, the pixel definition layer, and the first organic layer;

desorbing a portion of the second organic molecular thin film which corresponds to an opening of the plurality of openings through which the upper surface of the second sub-electrode is exposed;

providing a second organic layer on the second sub-electrode;

desorbing a remaining portion of the second organic molecular thin film from the first organic layer, the third sub-electrode, and the pixel definition layer;

providing a third organic molecular thin film comprising a self-assembled monolayer on the third sub-electrode, the pixel definition layer, the first organic layer, and the second organic layer;

desorbing a portion of the third organic molecular thin film which corresponds to an opening of the plurality of openings through which the upper surface of the third sub-electrode is exposed;

providing a third organic layer on the third sub-electrode;

desorbing a remaining portion of the third organic molecular thin film from the first organic layer, the second organic layer, and the pixel definition layer; and forming a second electrode on the first organic layer, the second organic layer, the third organic layer, and the pixel definition layer.

12. The method of claim 11, wherein the self-assembled monolayer of the first organic molecular thin film comprises:
a head group adsorbed to the first, second, and third sub-electrodes and the pixel definition layer;
a terminal group comprising a $CF_3$ group; and
a spacer group between the head group and the terminal group and comprising four or more and twenty-five or less $CF_2$ groups.

13. The method of claim 12, wherein the head group comprises a substituted or unsubstituted siloxane group or a substituted or unsubstituted acrylate group.

14. The method of claim 11, wherein each of the first, second, and third organic layers comprises a light emitting layer, and the light emitting layer comprises an organic electroluminescent light emitting material or a quantum dot.

15. The method of claim 11, wherein the first organic layer, the second organic layer, and the third organic layer comprise a red light emitting layer, a blue light emitting layer, and a green light emitting layer, respectively.

16. The method of claim 11, wherein the providing of the first, second, and third organic molecular thin films comprises providing the respective self-assembled monolayer by thermal evaporation, chemical vapor deposition, or electron beam evaporation.

17. The method of claim 11, wherein the desorbing of the first, second, and third organic molecular thin films comprises UV or plasma treating the first, second, and third organic molecular thin films.

18. The method of claim 11, wherein at least one organic layer among the first, second, and third organic layers comprises a hole transport region, a light emitting layer, and an electron transport region, which are sequentially stacked on at least one sub-electrode among the first, second, and third sub-electrodes.

19. The method of claim 11, wherein the providing of the first, second, and third organic layers comprises providing at least one organic layer among the first, second, and third organic layers by inkjet printing.

20. The method of claim 11, wherein the self-assembled monolayer of each of the first, second, and third organic molecular thin films is a derivative corresponding to one of the following S1 to S6:

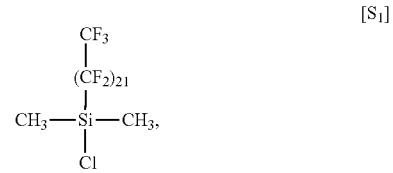

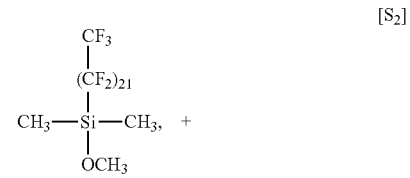

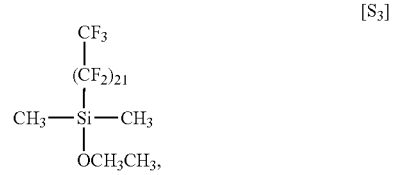

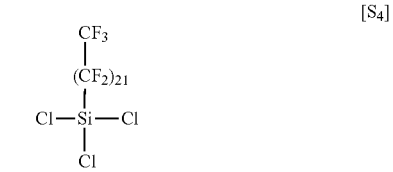

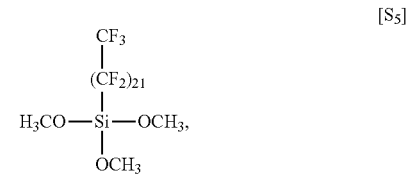

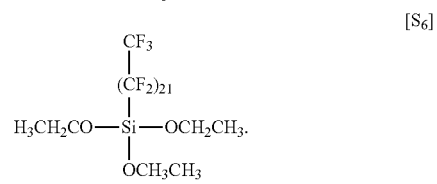

* * * * *

UNITED STATES PATENT AND TRADEMARK OFFICE
CERTIFICATE OF CORRECTION

PATENT NO. : 11,374,183 B2
APPLICATION NO. : 16/815662
DATED : June 28, 2022
INVENTOR(S) : Jaesik Kim et al.

Page 1 of 1

It is certified that error appears in the above-identified patent and that said Letters Patent is hereby corrected as shown below:

In the Claims

In Column 18, Lines 27-33, in Claim 20, in $S_3$, delete " 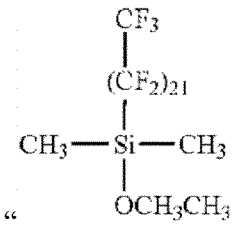 " and insert 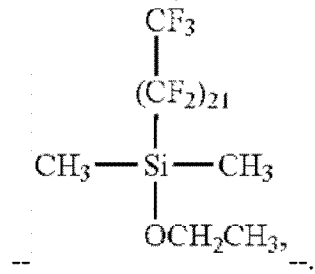 --.

In Column 18, Lines 47-53, in Claim 20, in $S_6$, delete " 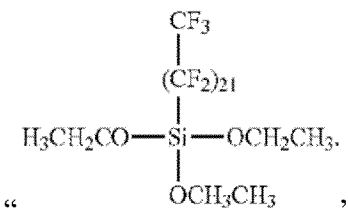 " and insert 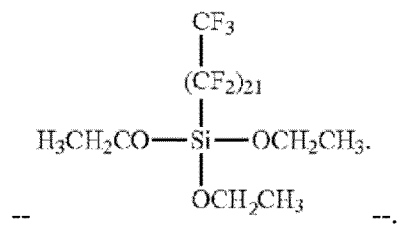 --.

Signed and Sealed this
Twelfth Day of March, 2024

Katherine Kelly Vidal

Katherine Kelly Vidal
*Director of the United States Patent and Trademark Office*